(12) United States Patent
Sharp et al.

(10) Patent No.: US 7,619,158 B2
(45) Date of Patent: Nov. 17, 2009

(54) THERMOELECTRIC DEVICE HAVING P-TYPE AND N-TYPE MATERIALS

(75) Inventors: Jeffrey W. Sharp, Richardson, TX (US); James L. Bierschenk, Rowlett, TX (US); Joshua E. Moczygemba, Wylie, TX (US)

(73) Assignee: Marlow Industries, Inc., Dallas, TX (US)

( * ) Notice: Subject to any disclaimer, the term of this patent is extended or adjusted under 35 U.S.C. 154(b) by 719 days.

(21) Appl. No.: 10/897,871

(22) Filed: Jul. 22, 2004

(65) Prior Publication Data

US 2004/0261830 A1    Dec. 30, 2004

Related U.S. Application Data

(60) Continuation-in-part of application No. 10/729,610, filed on Dec. 5, 2003, now abandoned, which is a division of application No. 09/872,394, filed on Jun. 1, 2001, now Pat. No. 6,660,925.

(51) Int. Cl.
*H01L 35/34* (2006.01)
*H01L 21/00* (2006.01)

(52) U.S. Cl. .................................. 136/201; 438/113
(58) Field of Classification Search ............... 136/201; 62/3; 438/113
See application file for complete search history.

(56) References Cited

U.S. PATENT DOCUMENTS

| 4,032,363 | A | 6/1977 | Raag | 136/211 |
|---|---|---|---|---|
| 5,064,476 | A | 11/1991 | Recine, Sr. | 136/201 |
| 5,171,372 | A | 12/1992 | Recine, Sr. | 136/203 |
| 5,576,512 | A | 11/1996 | Doke | 136/203 |

(Continued)

FOREIGN PATENT DOCUMENTS

JP    10242536 A  *  9/1998

(Continued)

OTHER PUBLICATIONS

Shaw et al., Engineering Problem Solving: A Classical Perspective, Copyright 2001 by Noyes Publication, p. 215.*

(Continued)

*Primary Examiner*—Jeffrey T. Barton
(74) *Attorney, Agent, or Firm*—Baker Botts L.L.P.

(57) ABSTRACT

A method of forming a thermoelectric device includes extruding a P/N-type billet to form a P/N-type extrusion having a first plurality of P-type regions and a first plurality of N-type regions. The P/N-type extrusion is sliced into a plurality of P/N-type wafers. A diffusion barrier metallization is applied to at least a subset of the P-type regions and N-type regions. One side of at least one P/N-type wafer is attached to a temporary substrate. The P/N-type regions of the P/N-type wafer are separated into an array of isolated P-type and N-type elements. The array of elements are coupled to a first plate having a first patterned metallization to form a thermoelectric circuit. The temporary substrate and bonding media may be detached from the P-type and N-type elements. The thermoelectric circuit may be coupled with a second plate at a second end of the thermoelectric circuit, second plate having a second patterned metallization.

24 Claims, 10 Drawing Sheets

U.S. PATENT DOCUMENTS

| | | | |
|---|---|---|---|
| 5,610,366 A | 3/1997 | Fleurial et al. | 136/202 |
| 5,627,112 A * | 5/1997 | Tennant et al. | 438/113 |
| 5,712,448 A | 1/1998 | Vandersande et al. | 136/203 |
| 5,747,728 A | 5/1998 | Fleurial et al. | 136/203 |
| 5,769,943 A | 6/1998 | Fleurial et al. | 117/219 |
| 5,831,286 A | 11/1998 | Fleurial et al. | 257/76 |
| 6,069,312 A | 5/2000 | Fleurial et al. | 136/236.1 |
| 6,274,802 B1 * | 8/2001 | Fukuda et al. | 136/201 |
| 6,288,321 B1 | 9/2001 | Fleurial et al. | 136/205 |
| 6,342,668 B1 | 1/2002 | Fleurial et al. | 136/201 |
| 6,388,185 B1 | 5/2002 | Fleurial et al. | 136/205 |
| 6,430,111 B1 * | 8/2002 | Shino | 368/204 |
| 6,458,319 B1 | 10/2002 | Caillat et al. | 420/576 |
| 6,660,925 B1 * | 12/2003 | Sharp | 136/201 |
| 2002/0014261 A1 | 2/2002 | Caillat et al. | 136/205 |
| 2002/0175312 A1 | 11/2002 | Fleurial et al. | 252/62.3 T |
| 2002/0176815 A1 | 11/2002 | Fleurial et al. | 423/263 |
| 2002/0189661 A1 | 12/2002 | Caillat et al. | 136/236.1 |
| 2003/0041892 A1 | 3/2003 | Fleurial et al. | 136/227 |
| 2003/0047204 A1 | 3/2003 | Fleurial et al. | 136/200 |
| 2003/0066476 A1 | 4/2003 | Caillat et al. | 117/3 |

FOREIGN PATENT DOCUMENTS

| | | |
|---|---|---|
| WO | WO 95/04377 | 2/1995 |
| WO | WO 99/38219 | 7/1999 |
| WO | WO 00/08693 | 2/2000 |
| WO | WO 02/05366 A1 | 1/2002 |
| WO | WO 02/089224 A1 | 11/2002 |

OTHER PUBLICATIONS

English Translation of Japanese Publication No. JP10-242536, Kamei et al., Manufacture of Thermoelectric Module, Nov. 1998.*

* cited by examiner

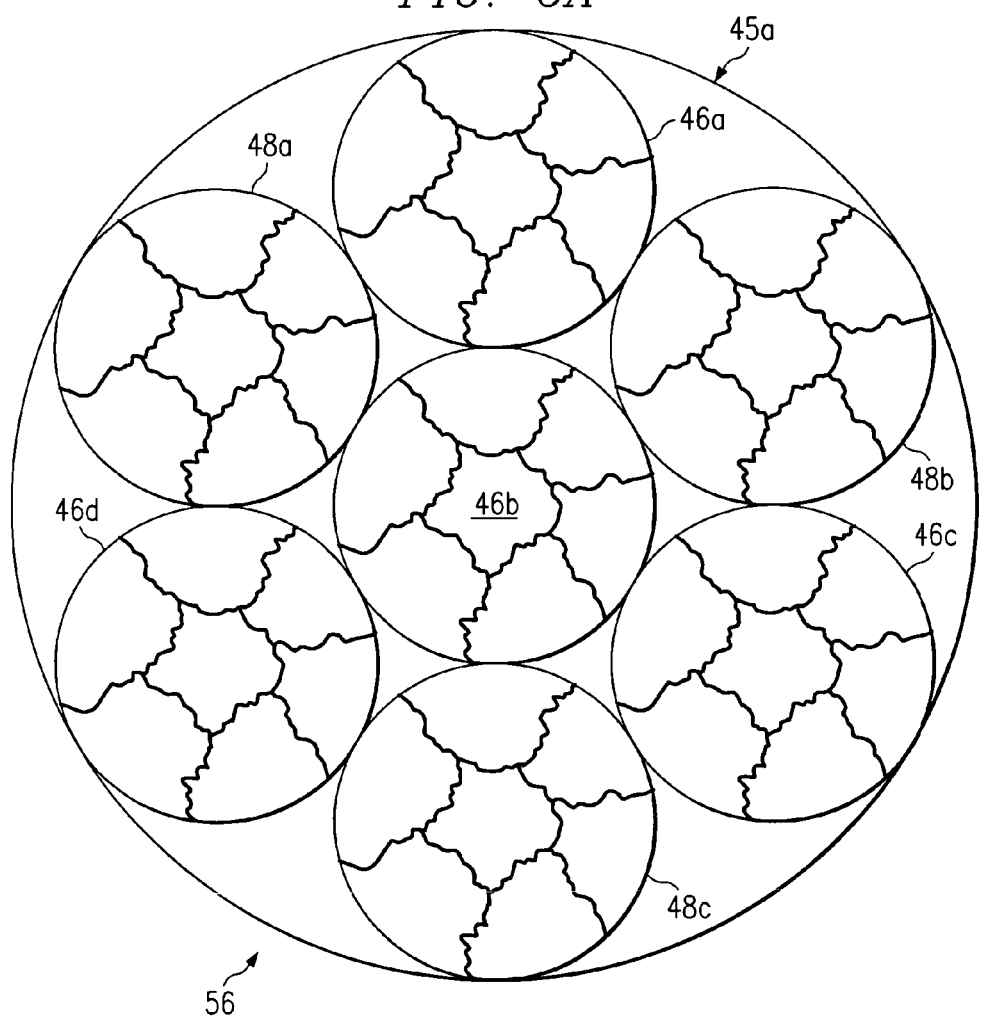

THERMOELECTRIC DEVICE HAVING P-TYPE AND N-TYPE MATERIALS

CROSS-REFERENCE TO RELATED APPLICATION

This application is a continuation-in-part of U.S. application Ser. No. 10/729,610 filed Dec. 5, 2003 and entitled "THERMOELECTRIC DEVICE HAVING CO-EXTRUDED P-TYPE AND N-TYPE MATERIALS," now abandoned, which is a divisional of U.S. patent application Ser. No. 09/872,394 filed Jun. 1, 2001 and entitled "THERMOELECTRIC DEVICE HAVING CO-EXTRUDED P-TYPE AND N-TYPE MATERIALS," now U.S. Pat. No. 6,660,925, issued Dec. 9, 2003.

TECHNICAL FIELD OF THE INVENTION

The present invention relates to semiconductor materials having enhanced thermoelectric properties for use in fabricating thermoelectric devices and more particularly, to a thermoelectric device having P-type and N-type material.

BACKGROUND OF THE INVENTION

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of materials used in fabrication of the associated thermoelectric elements. Materials used to fabricate other components such as electrical connections, hot plates and cold plates may also affect the overall efficiency of the resulting thermoelectric device.

Thermoelectric materials such as alloys of $Bi_2Te_3$, PbTe and BiSb were developed thirty to forty years ago. More recently, semiconductor alloys such as SiGe have been used in the fabrication of thermoelectric devices. Commercially available thermoelectric materials are generally limited to use in a temperature range between 200K and 1300K with a maximum ZT value of approximately one. Typically, a thermoelectric device incorporates both P-type and N-type semiconductor alloys as the thermoelectric materials.

In accordance with one method for the manufacture of a thermoelectric device, a billet of P-type material is extruded to form a P-type extrusion. Similarly, a billet of N-type material is extruded to form an N-type extrusion. The P and N-type extrusions are sliced into wafers, the wafers are sliced into elements, and the elements are mechanically loaded into a grid or "matrix" with the desired pattern and assembled upon a plate. P-type and N-type elements are typically arranged into rectangular arrays, in order to form a thermoelectric device. P-type and N-type legs alternate in both array directions. A metallization may be applied to the P-type wafers, N-type wafers, and/or the plate, in order to arrange the P-type wafers and the N-type wafers electrically in series and thermally in parallel.

For many thermoelectric devices, the elements dimensions are approximately 0.6 mm by 1.0 mm. Generally, the legs have a square cross-section perpendicular to the direction of current flow. Commonly, there are 18 to 36 pairs of P-type and N-type elements. Due to the size of the P-type and N-type elements, the elements are typically separated by hand, by using bowl sorters with pick and place automation, by using mass loading vibratory techniques, or any combination of the three, for installation upon the plate according to a predetermined generally alternating pattern. This method is time-consuming and intricate, and requires specialized equipment and experienced operators.

SUMMARY OF THE INVENTION

In accordance with teachings of the present invention, the design and preparation of semiconductor materials for fabrication of thermoelectric devices has been substantially improved to provide enhanced manufacturing and operating efficiencies. More specifically, a billet having P-type material and N-type material may be sliced into wafers and processed for assembly of thermoelectric circuits and/or thermoelectric devices.

In accordance with a particular embodiment of the present invention, a method of forming wafers, includes providing slabs of P-type material and slabs of N-type material. The slabs of P-type material and slabs of N-type material may be alternately stacked to form a P/N-type ingot from the slabs of P-type and N-type material. The P/N-type ingot may then be sliced into P/N-type wafers.

In accordance with another embodiment of the present invention, a method of forming a wafer includes loading P-type material powder and N-type material powder into a tool, alternatingly. The method further includes consolidating the P-type material powder and the N-type material powder using pressure and high temperature, to form a P/N-type ingot. The P/N-type ingot may then be sliced into P/N-type wafers.

The wafers obtained in accordance with the methods above may be further processed and used in the manufacture of thermoelctric devices.

Technical advantages of particular embodiments of the present invention includes a method for forming a wafer having a predetermined number of p-type regions and a predetermined number of N-type regions, arranged according to a predetermined configuration. Therefore, a wafer may be formed to suit the particular application and desired end product, simplifying the assembly of a thermoelectric device.

BRIEF DESCRIPTION OF THE DRAWINGS

For a more complete understanding of the present invention and its advantages, reference is now made to the following descriptions, taken in conjunction with the accompanying drawings, in which:

FIG. 6A is a schematic drawing illustrating a cross-section through a billet formed from portions of the extrusions of FIGS. 5A and 5B;

DETAILED DESCRIPTION OF THE INVENTION

Figure 1:
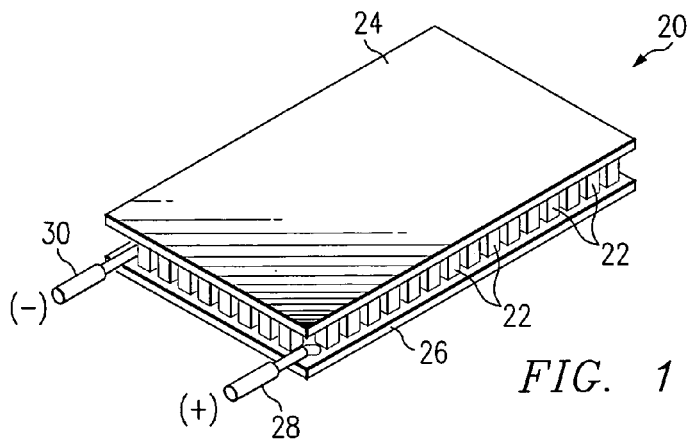
FIG. 1 is a schematic drawing showing an isometric view of a thermoelectric device having multiple thermoelectric elements which may be fabricated from semiconductor materials with crystal lattice structures incorporating teachings of the present invention.

FIG. 1 illustrates a thermoelectric device 20 including a plurality of thermoelectric elements (sometimes referred to as "thermocouples") 22 disposed between a cold plate 24 and a hot plate 26. Electrical connections 28 and 30 are provided to allow thermoelectric device 20 to be electrically coupled with an appropriate source of DC electrical power. In a particular embodiment of the present invention, thermoelectric elements 22 may be formed from a single component having both P-type and N-type regions. Therefore, manufacturing, handling, and assembly of thermoelectric device 20 is simplified, and performance of the thermoelectric device 20 is enhanced.

Thermoelectric device 20 may be used as a heater, cooler, electrical power generator and/or temperature sensor. If thermoelectric device 20 were designed to function as an electrical power generator, electrical connections 28 and 30 would represent the output terminals from such a power generator operating between hot and cold temperature sources. The thermoelectric figure of merit (ZT) of thermoelectric device 20 will vary depending upon the type of use. For example, thermoelectric device 20 may have a first value of ZT when used as a cooler and a second, different value of ZT when used as an electrical power generator.

Figure 2:
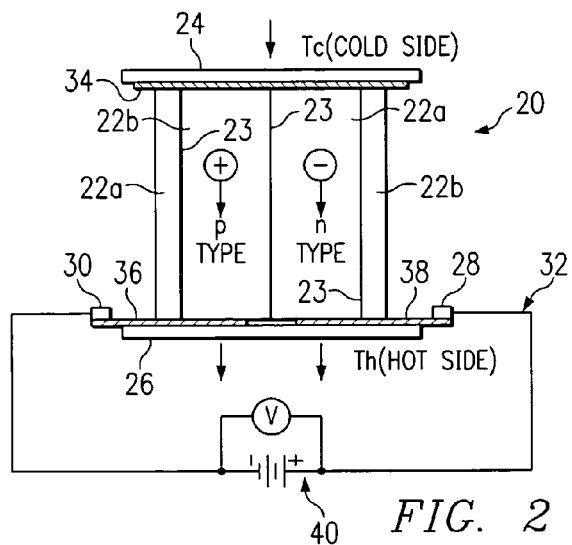
FIG. 2 is an electrical schematic drawing of one thermocouple of the thermoelectric device of FIG. 1.

FIG. 2 is a schematic representation of an electrical circuit 32 of single stage thermoelectric device 20. Electrical circuit 32 may also be incorporated into thermoelectric elements or thermocouples to convert heat energy into electrical energy. Electric circuit 32 generally includes two or more thermoelectric elements 22 fabricated from dissimilar semiconductor materials such as N-type thermoelectric elements 22a and P-type thermoelectric elements 22b. Thermoelectric elements 22 are typically configured in a generally alternating N-type element to P-type element arrangement. A barrier 23 may be formed between each P-type element 22a and adjacent N-type elements 22b. In many thermoelectric devices, semiconductor materials with dissimilar characteristics are connected electrically in series and thermally in parallel. The phrase "semiconductor materials" is used in this application to include semiconductor compounds, semiconductor alloys and mixtures of semiconductor compounds and alloys formed in accordance with teachings of the present invention for use in fabricating thermoelectric elements and thermoelectric devices.

Examples of thermoelectric devices and methods of fabrication are shown in U.S. Pat. No. 5,064,476 entitled Thermoelectric Cooler and Fabrication Method; U.S. Pat. No. 5,171,372 entitled Thermoelectric Cooler and Fabrication Method; and U.S. Pat. No. 5,576,512 entitled Thermoelectric Apparatus for Use With Multiple Power Sources and Method of Operation.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between cold side or cold plate 24 and hot side or hot plate 26 through thermoelectric elements 22 when subject to a DC voltage potential. These same agents or carriers may generate electrical power when an appropriate temperature difference is present between cold side 24 and hot side 26.

In thermoelectric device 20, alternating thermoelectric elements 22a, and 22b of N-type and P-type semiconductor materials may be sliced from a single ingot having both P-type regions and N-type regions separated by barriers 23, and have their ends connected by electrical conductors such as 34, 36 and 38. In lieu of barriers 23, spaces may be left and/or formed between adjacent P-type regions and N-type regions, in accordance with the teachings of the present invention. Conductors 34, 36 and 38 may be metallization formed on thermoelectric elements 22a, 22b and/or on the interior surfaces of plates 24 and 26.

Ceramic materials are frequently used to manufacture plates 24 and 26 which define in part the cold side and hot side, respectively, of thermoelectric device 20. Commercially available thermoelectric devices that function as a cooler generally include two ceramic plates with separate P-type and N-type thermoelectric elements formed from bismuth telluride ($Bi_2Te_3$) alloys disposed between the ceramic plates and electrically connected with each other.

When DC electrical power from power supply 40 is properly applied to thermoelectric device 20 heat energy will be absorbed on cold side 24 of thermoelectric elements 22 and will be dissipated on hot side 26 of thermoelectric device 20. A heat sink or heat exchanger (sometimes referred to as a "hot sink") may be attached to hot plate 26 of thermoelectric device 20 to aid in dissipating heat transferred by the associated carriers and phonons through thermoelectric elements 22 to the adjacent environment. In a similar manner, a heat sink or heat exchanger (sometimes referred to as a "cold sink") may be attached to cold side 24 of thermoelectric device 20 to aid in removing heat from the adjacent environment. Thus, thermoelectric device 20 may sometimes function as a thermoelectric cooler when properly connected with power supply 40. However, since thermoelectric devices are a type of heat pump, thermoelectric device 20 may also function as a heater, power generator, or temperature sensor.

Figure 3A:
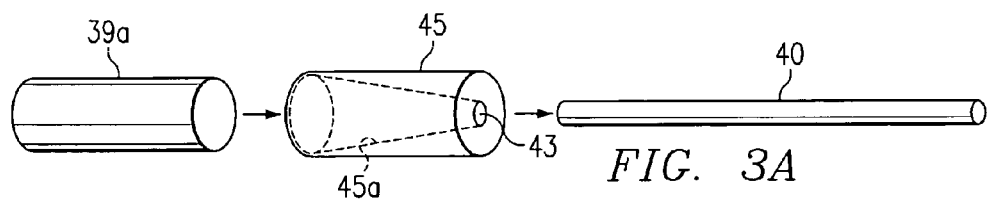
FIG. 3A is a schematic drawing illustrating a P-type extrusion formed by placing a billet into an extruder.
Figure 3B:
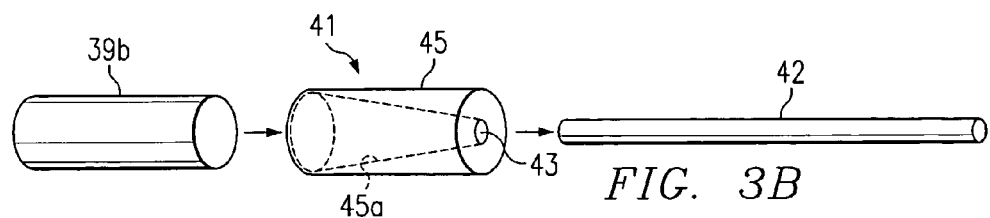
FIG. 3B is a schematic drawing illustrating an N-type extrusion formed by placing a billet into an extruder.

FIGS. 3A and 3B illustrate a P-type extrusion 40 and a N-type extrusion 42 formed using extruder 41. P-type extrusion 40 is formed from a typical extrusion process in which semi-soft, billet 39a of P-type material is heated and forced through orifice 43 of die 45 to produce a continuously formed piece in the shape of the desired product. In the illustrated embodiment, orifice 43 includes a circular configuration, and forms a generally cylindrical P-type extrusion 40.

Similarly, N-type extrusion 42 is formed from an extrusion process in which a billet 39b of semi-soft N-type material is heated and forced through the orifice 43 of die 45 to produce a continuously formed piece in the shape of the desired product. In the illustrated embodiment, P-type extrusion 40 and N-type extrusion 42 each includes circular cross-sections. However, various other configurations are available for use within the present invention. Such configurations include, but are not limited to, square and/or rectangular configurations.

P-type extrusion 40 and N-type extrusion 42 of the illustrated embodiment may be formed by loading $1^{1/8}$ inch diameter billets 39a, 39b of P-type material and N-type material, respectively, into an extruder where it is reduced to a cross-section of approximately ⅜ inches. In accordance with the teachings of the present invention, P-type extrusion 40 and N-type extrusion 42 may be segmented and fed back into the extruder as the "billet" for a second extrusion. This process may be further repeated as desired, in order to form one or more extrusions having a plurality of N-type material regions and a plurality of P-type material regions.

Figure 4A:
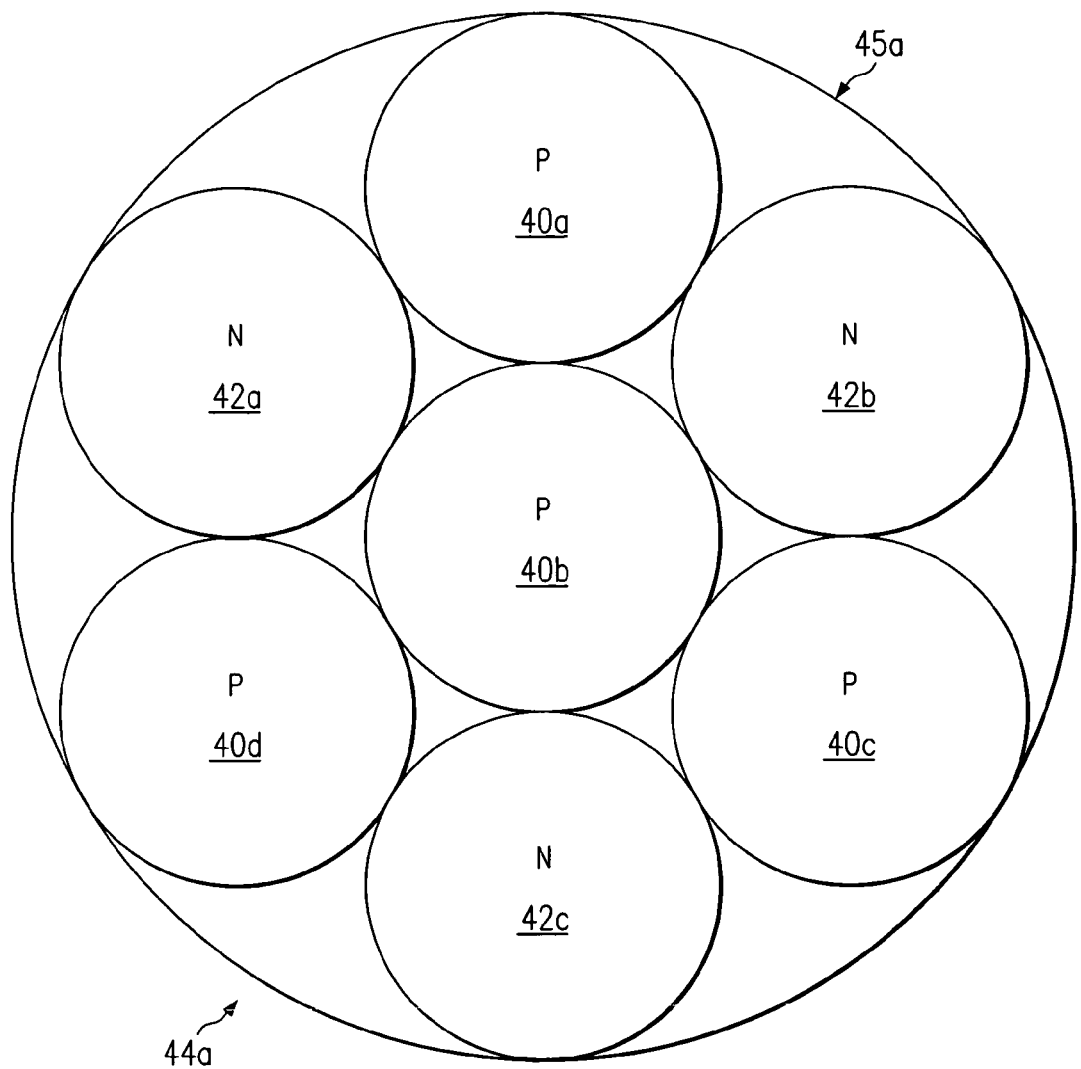
FIG. 4A is a schematic drawing illustrating a cross-section through a billet formed using various segments of the extrusions of FIGS. 3A and 3B.
Figure 4B:
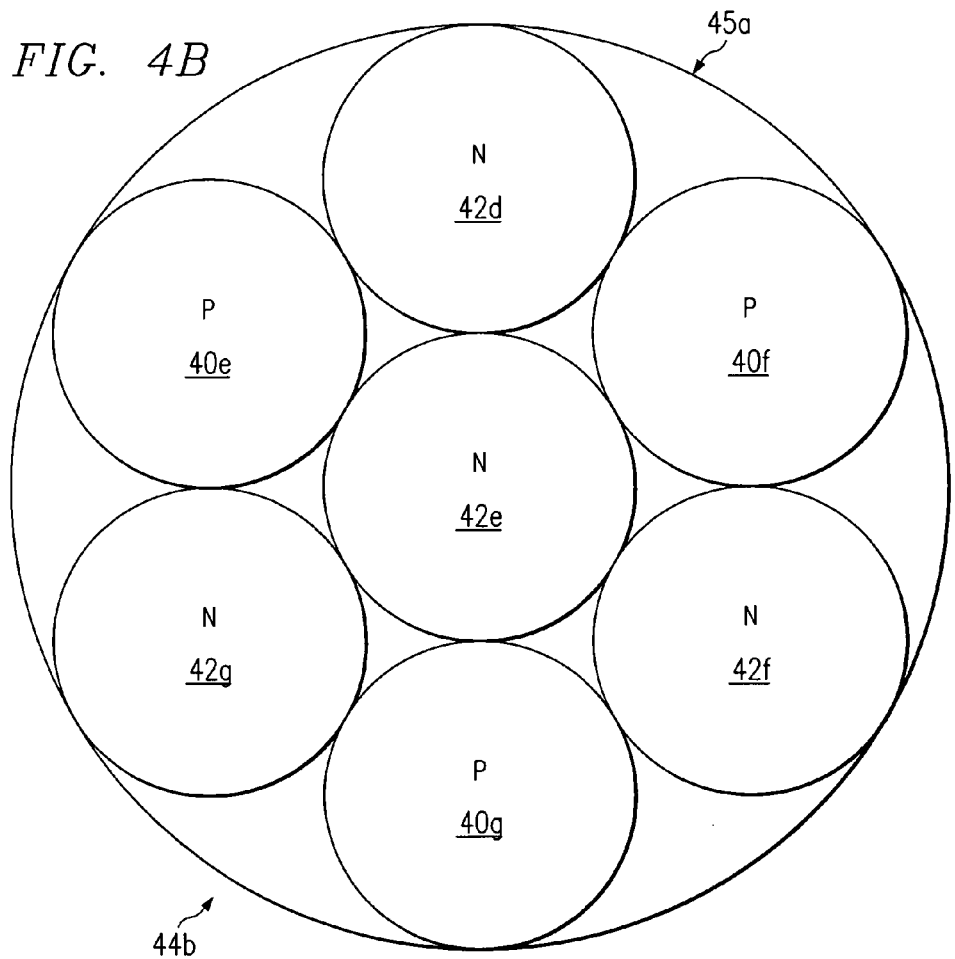
FIG. 4B is a schematic drawing illustrating a cross-section through a billet formed using various segments of the extrusions of FIGS. 3A and 3B.

FIGS. 4A and 4B illustrate cross-sections through segmented extrusion portions of P-type extrusion 40, including P-type extrusion 40a-40g. Similarly, N-type extrusions 42a-42g represent segmented portions of N-type extrusion 42. P-type extrusions 40a-40g and N-type extrusion 42a-42g may be combined in a predetermined configuration and loaded into extruder 41. In the illustrated embodiment of FIG. 3B, extruder 41 includes an interior wall 45a having an approximately $1^{1/8}$ inch diameter. Since each P-type extrusion 40a-40g and N-type extrusion 42a-42g are approximately ⅜ inches in diameter, seven segmented extrusion portions may be combined and extruded in one or more extrusion processes. A total of four P-type extrusions 40a-40d and three N-Type extrusions 42a-42c are loaded into extruder 41 and formed into a billet as illustrated on FIG. 4A. During the next extrusion process, four N-type extrusions 42d-42g, and three P-type extrusions 40e-40g are formed into a billet 44b and loaded into extruder 41, as illustrated in FIG. 4B.

It will be recognized by those of ordinary skill in the art that the number, size and/or configuration of each segmented extrusion portion may be significantly modified within the teachings of the present invention. Furthermore, the number of extrusion processes performed may be selected to suit the particular application and desired end finished product. Each subsequent extrusion process may be performed upon a billet comprising P-type materials, N-type materials, and/or hybrid P and N-type materials.

Figure 5A:
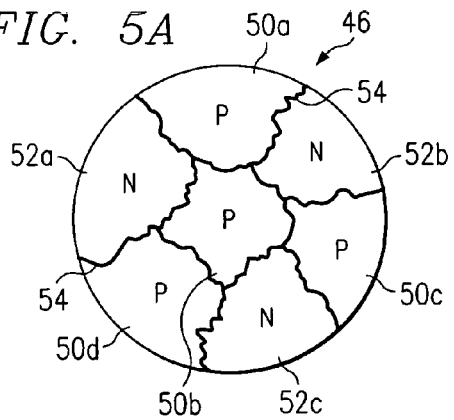
FIG. 5A is a schematic drawing illustrating a cross-section through an extrusion formed from the billet of FIG. 4A.
Figure 5B:
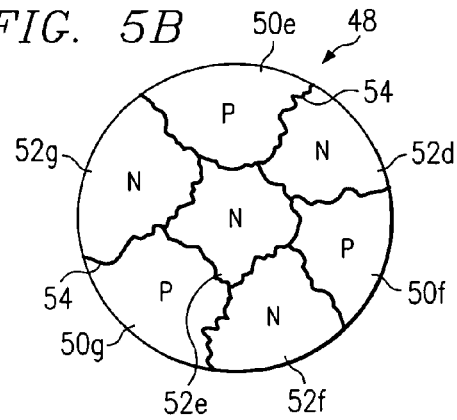
FIG. 5B is a schematic drawing illustrating a cross-section through an extrusion formed from the billet of FIG. 4B.

FIGS. 5A and 5B illustrate cross-sections through P/N-type extrusions 46 and 48 formed from billets 44a and 44b illustrated in FIGS. 4A and 4B, respectively. P/N-type extrusion 46 includes four P-type regions 50a-50d and three N-type regions 52a-52c. P-type regions 50a-50d correspond to P-type extrusions 40a-40d of FIG. 4A. Similarly, N-type regions 52a-52c correspond to N-type extrusions 42a-42c of FIG. 4A. Each P-type region 50a-50d and N-type region 52a-52c may be separated from adjacent P-type and/or N-type regions by a plurality of barriers 54.

As will be described later in more detail, each barrier 54 may include a passivating agent operable to, at least in part, thermally, chemically and/or electrically isolate each P-type portion and N-type portion from adjacent P-type and N-type portions. The configuration of each P-type region 50a-50d and N-type region 52a-52c is consistent with the deformation that occurs during the extrusion process as the billets of FIGS. 4A and 4B are formed and compressed from an approximately $1^{1/8}$ inch diameter billet 44a to an approximately ⅜ inch diameter extrusion 46.

P/N-type extrusion 48 includes three P-type regions 50e-50g, and four N-type regions 52d-52g. P-type regions 50e-50g correspond to P-type extrusions 40e-40g of FIG. 4B. Similarly, N-type regions 52d-52g correspond to N-type extrusions 42d-42g of FIG. 4B. Barriers 54 separate P-type 50e-50g and N-type 52d-52g regions from adjacent P-type and/or N-type regions. In the next step, P/N-type extrusion 46 and P/N-type extrusion 48 may be segmented and used as "billet" in the next stage. However, in an alternative embodiment, a "single pass" extrusion process may be sufficient, within the teachings of the present invention. In this embodiment, the extrusions of FIG. 5A and/or 5B may be sliced and processed further for the manufacture of a thermoelectric element or device, in accordance with one or more of the techniques described within this specification.

Figure 6B:
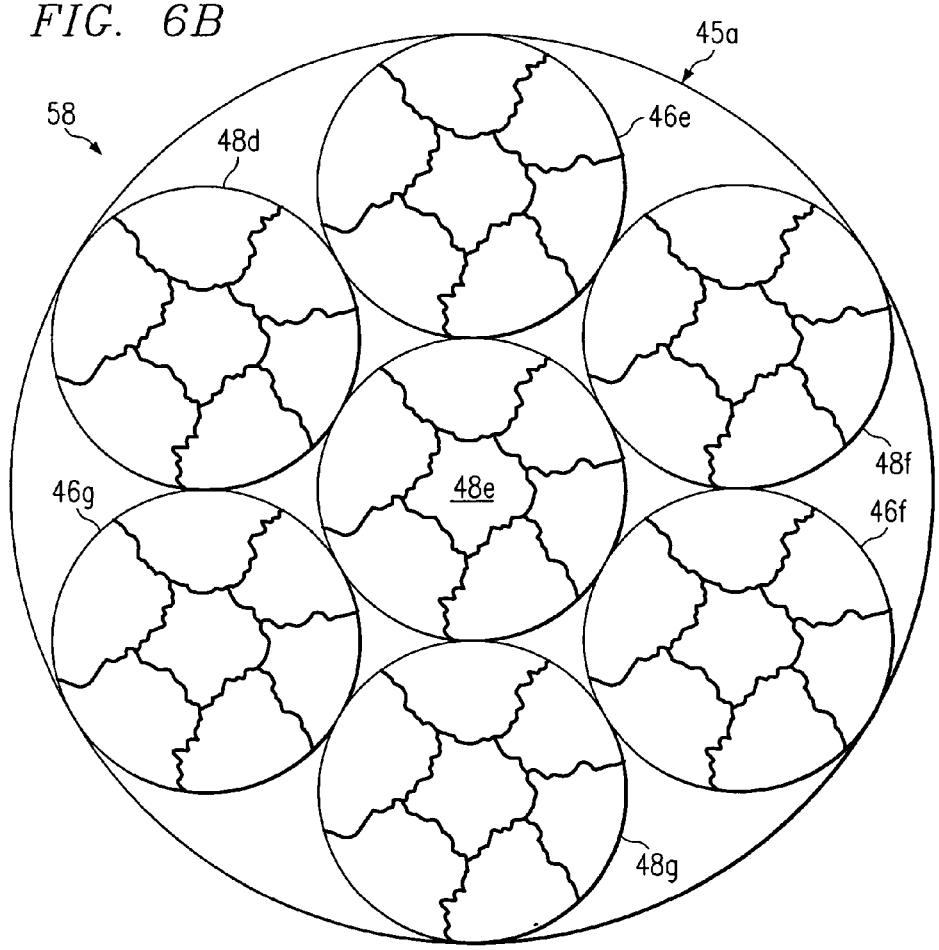
FIG. 6B is a schematic drawing illustrating a cross-section through a billet formed from portions of the extrusions of FIGS. 5A and 5B.

FIGS. 6A and 6B illustrate another stage of the process. Billets 56 and 58 are fed into die 45. Billet 56 includes four P/N-type extrusions 46a-46d and three P/N-type extrusions 48a-48c. Similarly, billet 58 includes three P/N-type extrusions 46e-46g and four P/N-types extrusions 48d-48g. Billet 56 and 58 are extruded within extruder 41, and therefore compressed and reduced from an approximately $1^{1/8}$ inch aggregate diameter to an approximately ⅜ inch diameter extrusion, as illustrated in FIGS. 7A and 7B.

Figure 7A:
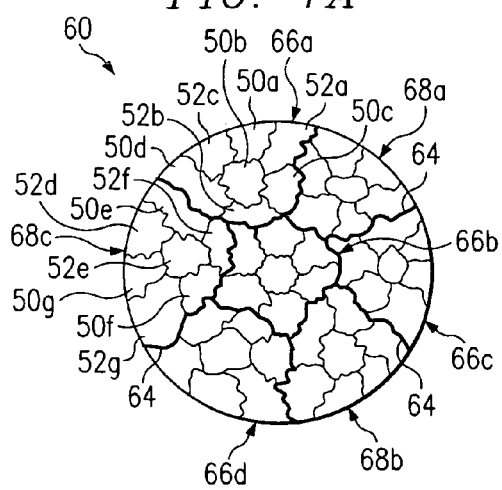
FIG. 7A is a schematic drawing illustrating a cross-section through an extrusion formed from the billets of FIGS. 6A and 6B.
Figure 7B:
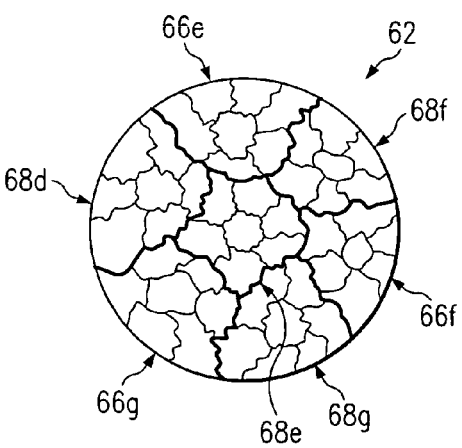
FIG. 7B is a schematic drawing illustrating a cross-section through an extrusion formed from the billets of FIGS. 6A and 6B.

FIGS. 7A and 7B illustrate cross-sections through extrusions 60 and 62 which are the product of extruding billets 56 and 58 of FIGS. 6A and 6B. Extrusion 60 includes a plurality of P/N-type regions 66a-66d and a plurality of P/N-type regions 68a-68c. Each P/N-type region 66a-66d includes a plurality of P-type regions 50a-50d and a plurality of N-type regions 52a-52c, since billet 56 is formed from segmented portions of extrusions 46 and 48. Barriers 64 may be formed between each adjacent P/N-type extrusion 66a-66d and P/N-type extrusion 68a-68c. For illustrative purposes, barriers 64 are illustrated in dark lines in FIGS. 7A and 7B.

Similar to barriers 54, barriers 64 may include a passivating agent. The configuration of P/N type regions 66, P/N-type regions 68, P-type regions 50, N-type regions 52, boundaries 54, and boundaries 64 represent the compression and deformation experienced from billets 56 and 58 being reduced from approximately $1^{1/8}$ inch diameter to approximately $3/8$ inch diameter extrusions.

In the illustrated embodiment of FIGS. 7A and 7B, P/N-type extrusion 60 includes a total of four P/N-type regions 66*a*-66*d* and three P/N-type regions 68*a*-68*c*. Each P/N-type region 66*a*-66*d* includes four P-type regions 50*a*-50*d* and three N-type regions 52*a*-52*c*. Each P/N-type region 68*a*-68*c* includes three P-type regions 50*e*-50*g* and four N-type regions 52*d*-52*g*. Therefore, P/N-type extrusion 60 includes a total of twenty five P-type regions and 24 N-type regions.

P/N-type extrusion 62 includes three P/N-type extrusion segments 66*e*-66*g* and four P/N-type extrusion segments 68*d*-68*g*. Each P/N-type extrusion segment 66*e*-66*g* includes four P-type regions 50*a*-50*d* and three N-type regions 52*a*-52*c*, and each extrusion segment 68*d*-68*g* includes three P-type regions 50*e*-50*g*, and four N-type regions 52*d*-52*g*. Therefore, P/N-type extrusion 62 includes 24 P-type regions and twenty five N-type regions.

The number, size and/or configurations of P-type extrusions 40, N-type extrusions 42, and P/N-type extrusions 46, 48, 60 and/or 62 may be significantly modified within the teachings of the present invention. Therefore the final product of the process described above may include any number, size, and/or configuration of P-type regions 50, N-type regions 52, and/or P/N-type regions 66 and 68.

Figure 8A:
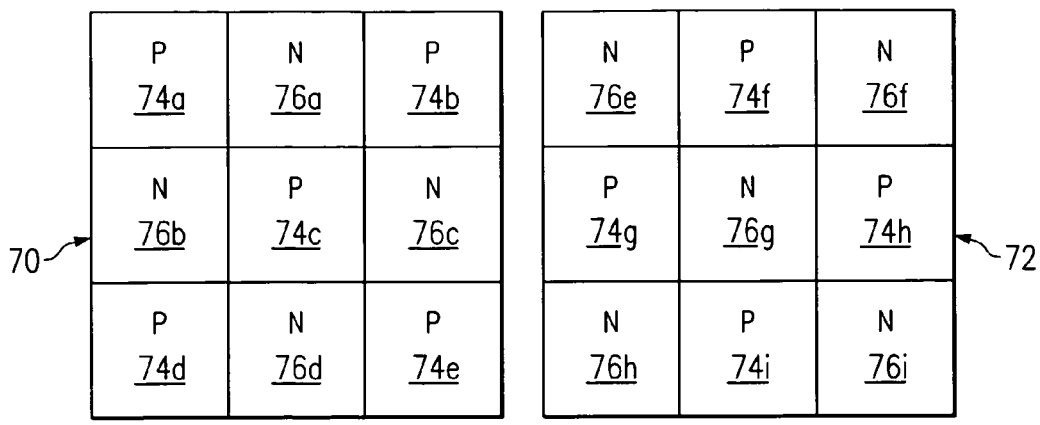
FIG. 8A is a schematic drawing illustrating cross-sections through extrusions having P-type regions and N-type regions.

FIG. 8A illustrates cross-sections through P/N-type extrusions 70 and 72. P/N-type extrusion 70 is formed generally according to the process described above, with the exception of the shape of the extruder chamber and associated orifice. P/N-type extrusion 70 is the product of an extruder having a rectangular (e.g. square) orifice. Therefore, P/N-type extrusion 70 includes five P-type regions 74*a*-74*e*, and four N-type regions 76*a*-76*d*. Similarly, P/N-type extrusion 72 includes four P-type regions 74*f*-74*i* and five N-type regions 76*e*-76*i*. Each P/N-type extrusion 70 and 72 may be segmented for use as billet and another extrusion process.

Figure 8B:
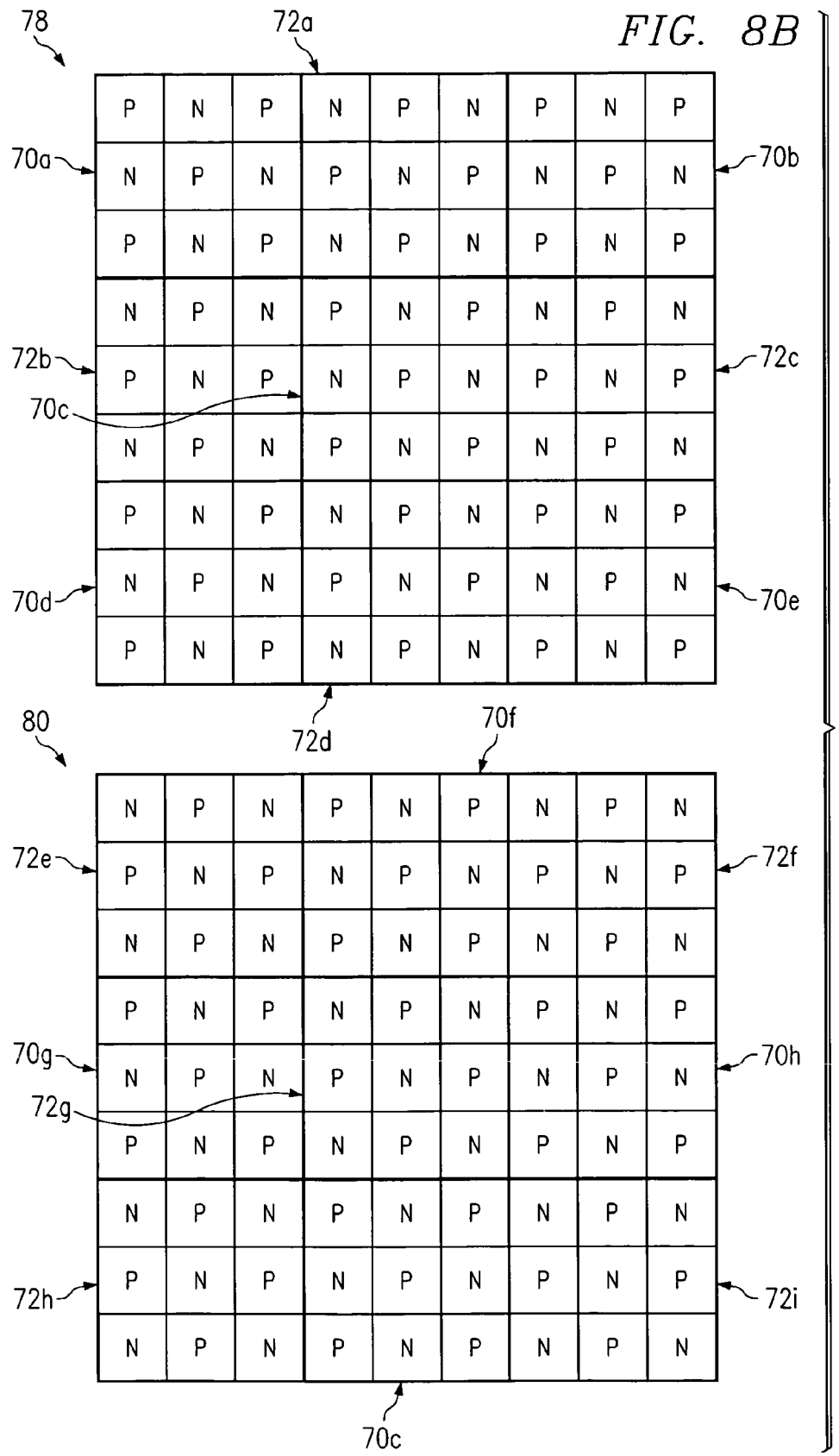
FIG. 8B is a schematic drawing illustrating cross-sections through extrusions formed using segmented portions of the extrusions of FIG. 8A.

FIG. 8B illustrates cross-sections through two P/N-type extrusions 78 and 80 formed by extruding billets that include segmented portions of P/N-type extrusions 70 and 72. P/N-type extrusion 78 includes five segmented portions 70*a*-70*e* of P/N-type extrusion 70 and four segmented portions 72*a*-72*d* of P/N-type extrusion 72. The boundaries between segmented portions 70*a*-70*e* and 72*a*-72*d* are shown in dark lines in FIG. 8B, for illustrative purposes. Each segmented portion 70*a*-70*e* includes five P-type regions 74*a*-74*e* and four N-type regions 76*a*-76*d*. Each segmented portion 72*a*-72*d* includes four P-type regions 74*f*-74*i* and five N-type regions 76*e*-76*i*. Therefore, P/N-type extrusion 78 includes a total of forty-one P-type regions and forty N-type regions.

P/N-type extrusion 80 of FIG. 8B includes four segmented portions 70*f*-70*i* of P/N-type extrusion 70, and five segmented portions 72*e*-72*i* of P/N-type extrusion 72. The boundaries between segmented portions 70*f*-70*i* and 72*e*-72*i* of P/N-type extrusion 80 are shown in dark lines in FIG. 8B, for illustrative purposes. P/N-type extrusion 80, therefore, has a total of forty-one N-type regions and forty P-type regions.

It will be realized by those having ordinary skill in the art that the teachings of the present invention may be used to produce a P/N-type extrusion of practically any size and/or configuration and having practically any number of P-type regions and/or N-type regions arranged in a predetermined configuration. Such P/N-type extrusions, including P/N-type extrusions 70, 72, 78 and/or 80, may be sliced into wafers and used in the assembly of thermoelectric devices.

In particular embodiments of the present invention, each P-type extrusion 40, N-type extrusion 42, P/N-type extrusion 46, 48, 60, 62, 70, 72, 78 and/or 80 may be coated with a surface passivating agent prior to forming the billet and/or an extrusion process. The passivating agent may be operable to, at least in part, electrically, chemically and/or thermally isolate each P-type and N-type region from adjacent P-type and N-type regions. In the illustrated embodiments, boron nitride powder is applied prior to forming each billet, and forms barriers 54 and 64. However, other passivating agents and application techniques are available for use within the teachings of the present invention. For example, a passivating agent having a relatively low thermal conductivity may be appropriate to form barriers 54 and 64. The passivating agent may be one or more of various chemically inert electrical insulators/thermal insulators.

In accordance with another embodiment of the present invention, barriers 54 and/or 64 may comprise a separating layer that may be temporary or permanent. In accordance with one embodiment, the separating layer may be an insulator that electrically isolates P-type material from N-type material. However, the separating material may also be a conductor.

If the separating material is a conductor, it will be a temporary separating layer. For example, if a temporary separating layer is used, the separating layer would be removed prior to fabrication of the thermoelectric device. The removal of the temporary separating layer may be accomplished using one or more of the various methods described within this specification, as well as others. For example, the separating layer may be partially or entirely removed by sawing and/or etching. Both insulating separating layers and conductive separating layers may be removed from the wafer, using chemicals that would not adversely impact the thermoelectric material of the wafer.

The separating material may be any material that is placed between one or more adjacent N-type and P-type materials. The separating material may include a separate sheet/foil or be applied as a coating. The separating material provides the ability to provide gaps between P-type and N-type material, without dicing or using a mask to selectively remove thermoelectric material at the P/N type material boundaries. In accordance with a particular embodiment of the present invention, nickel foil may be used as the separating material, since nickel may be etched without impacting the adjacent thermoelectric material. In another embodiment, an etchable glass may be used as the separating material.

Figure 9:
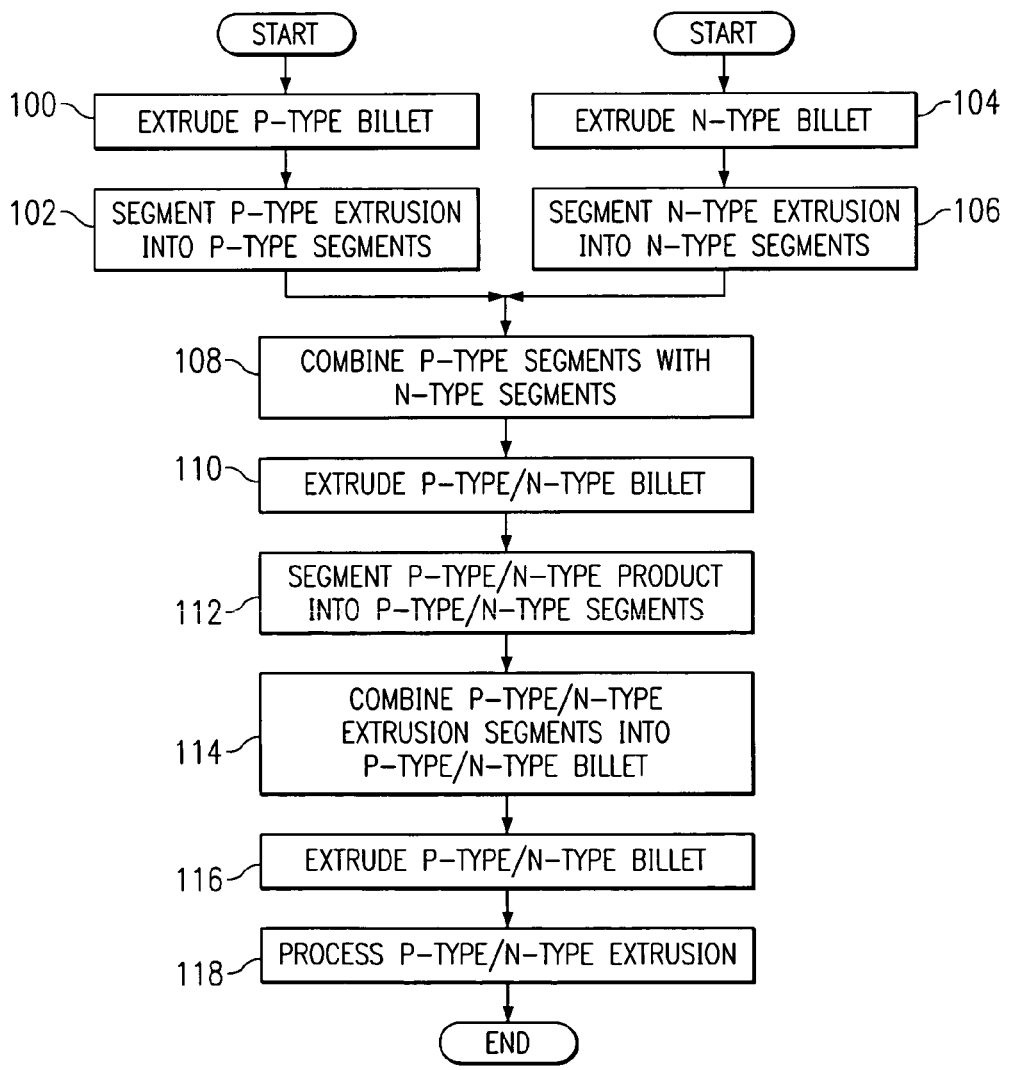
FIG. 9 is a block diagram illustrating a method for forming a thermoelectric device, in accordance with a particular embodiment of the present invention.

FIG. 9 illustrates a method for forming a thermoelectric device, in accordance with a particular embodiment of the present invention. The method begins at step 100 where a billet of P-type material is extruded to form a P-type extrusion. At step 102, the P-type extrusion is segmented into a plurality of P-type extrusion segments. The length of the P-type segments may be selected to correspond to the approximate length of the particular extrusion chamber being used.

Next, at step 104, a billet of N-type materials is extruded in order to form an N-type extrusion. At step 106, the N-type extrusion is segmented into a plurality of N-type extrusion segments. The P-type extrusion segments of step 102 and N-type extrusion of step 106 may be combined for further processing.

In a particular embodiment of the present invention, respective P-type and N-type material billets each having a $1^{1/8}$ inch diameter may be used to produce corresponding $3/8$ inch diameter extrusions approximately thirty inches long. Accordingly, seven extrusion segments of each P-type and N-type extrusions are formed.

At step 108, one or more P-type extrusion segments are combined with one or more N-type extrusion segments, in order to form a billet. The billet may include any number of P-type segments and any number of N-type segments. The ratio of P-type segments to N-type segments may be varied significantly depending upon the particular application and desired end product. At step 110, the billet including P-type segments and N-type segments is extruded to form a P/N-type extrusion. The P/N-type extrusion is segmented at step 112, into a plurality of P/N-type extrusion segments.

At step 114, a plurality of P/N-type extrusion segments are combined to form a P/N-type billet for further extruding. The P/N-type extrusion segments may be identical in configuration, representing segments of the P/N-type extrusion of step 110. However, P/N-type extrusion segments with different cross-sections and configurations may be combined at this step depending upon the particular application and desired end product. The cross-section and configuration of various P/N-type extrusion segments used in this step may be selected in order to achieve an extrusion having a pre-determined number of P-type regions and N-type regions.

Next, at step 116, the billet including a plurality of P/N-type extrusion segments is extruded in order to form a P/N-type extrusion. The P/N-type extrusion of step 116 will include a plurality of P-type regions and a plurality of N-type regions corresponding to the number of P-type extrusion segments, N-type extrusion segments and/or P/N-type extrusion segments selected above at steps 108 and 114. The P/N-type extrusion of step 116 may be segmented to form the billet for another extrusion process, depending upon the specific application and desired end product.

Finally, at step 118, the P/N-type extrusion of step 116 is processed to form one or more thermoelectric wafers. The processing may also include the assembly of a thermoelectric device.

The P/N-type extrusion of step 116 may be sliced into wafers of a predetermined thickness. For example, the illustrated embodiment envisions slicing the P/N-type extrusion into 0.040 inch thickness wafers so that the wafers may be electrically coupled with a plate. The wafer may also be modified, processed or sliced in order to provide a wafer of practically any geometric configuration, including square, rectangular, or circular. The plate may include a patterned metallization in order to form a thermoelectric circuit.

In accordance with one embodiment of the present invention, the wafers may be "diced" prior to assembly of the thermoelectric device, in order to separate the P-type material from the N-type material. Dicing is a process wherein a P-type material and N-type material are mechanically separated by a sawing technique. Dicing may be accomplished "in-place" meaning the separation occurs after the wafer is coupled with a substrate, or dicing may be accomplished loosely, meaning the P-type material and N-type material must be collected, separated, and arranged upon a substrate, in order to form a thermoelectric device.

In accordance with another embodiment of the present invention, the wafer may be masked and etched, in order to separate P-type material from N-type material. The etching process may be a "wet-etching" technique or a "dry-etching" technique.

Alternatively, if a sufficient barrier is formed between the P-type and N-type material, the wafers may be coupled with both plates without additional separation (e.g., dicing, etching, etc.). The barrier may comprise the separator materials, or separating layers, described within this specification.

In a particular embodiment of the present invention, the thermoelectric circuit has individual legs arranged electrically in series and thermally in parallel. For example, using the process described above, a circuit having 24 P-N couples may be formed from wafers sliced from the products of FIGS. 7A and 7B. One or more circuits may be coupled with hot and cold plates in order to form a thermoelectric element similar to thermoelectric device 20 of FIG. 1.

Figure 10:
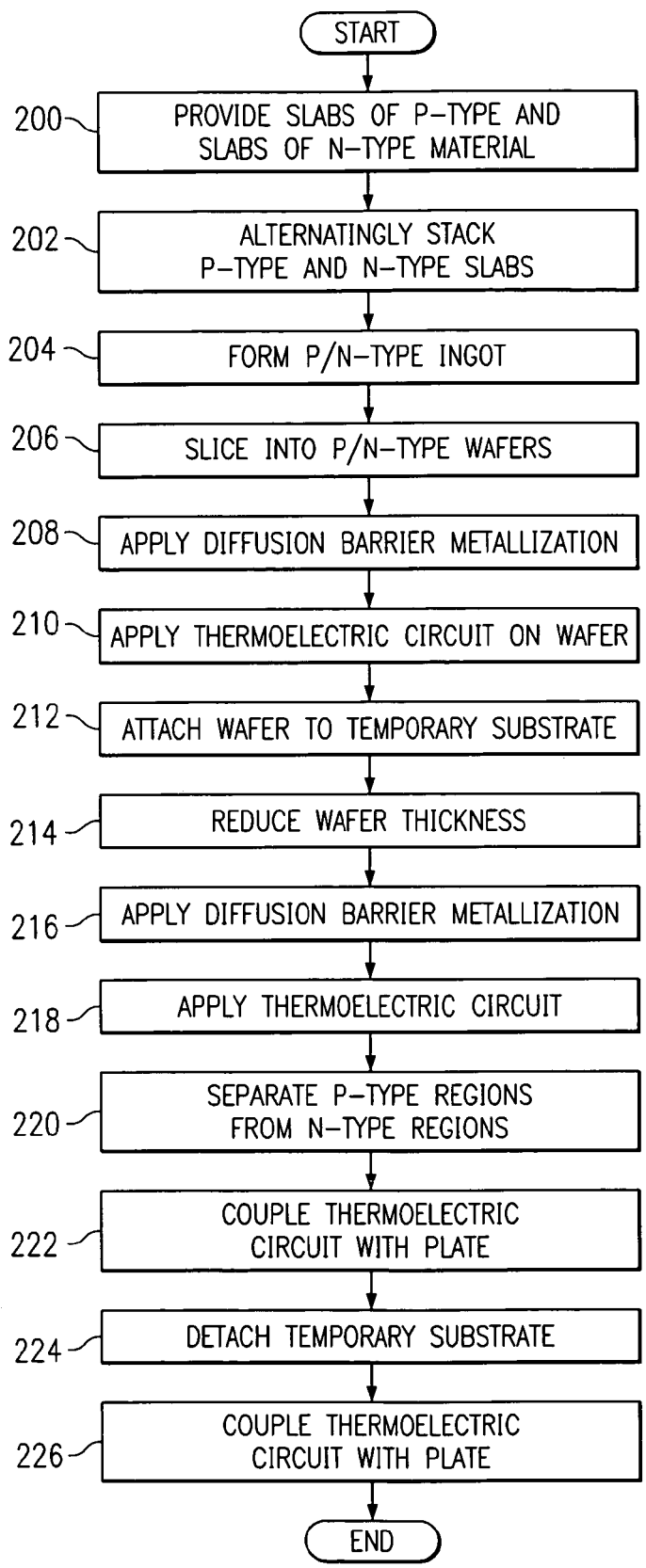
FIG. 10 is a block diagram illustrating a method for forming a thermoelectric device, in accordance with a another embodiment of the present invention.
Figure 11:
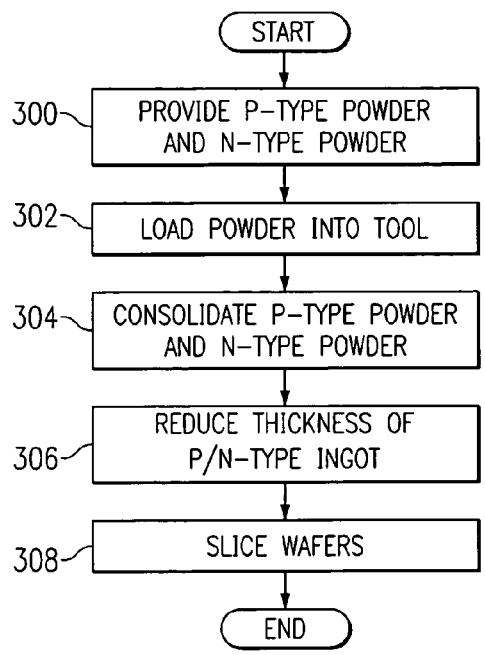
FIG. 11 is a block diagram illustrating a method for forming a thermoelectric device, in accordance with yet another embodiment of the present invention.

FIGS. 10 and 11 illustrate methods of forming wafers for use in the manufacture of thermoelectric devices, in accordance with alternative embodiments of the present invention. Such wafers, as well as wafers sliced from the extrusions of FIGS. 7A-B and 8A-B may be formed and processed in one or more of the variety of methods discussed within this specification, and other methods that are generally known in the art. The wafers formed by slicing the extrusions of FIGS. 7A-B and 8A-B may generally be referred to as a "checkerboard pattern" of P-type and N-type material. The wafers formed in accordance with the methods of FIGS. 10 and 11 may be referred to generally as a "striped pattern." Referring to FIG. 10, the method begins at step 200 where slabs of P-type material and slabs of N-type material are provided. The slabs may be formed in accordance with one or more of a variety of known techniques. For example, each slab may be individually formed to the desired thickness (e.g., 20-40 mils thick) before processing. Alternatively, respective blocks of P-type material and N-type material may be sliced such that the desired thickness of material is achieved. In accordance with one embodiment of the present invention, the slabs that are provided at step 200 may be approximately 30 mils thick.

Figure 12:
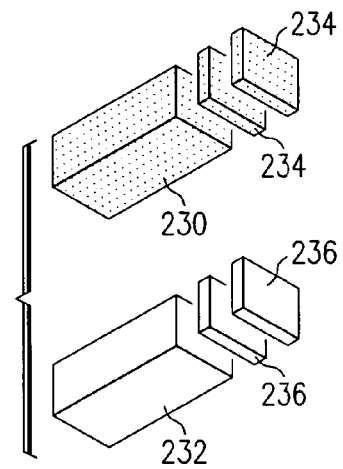
FIG. 12 illustrates slabs of P-type material and slabs of N-type material, slices from blocks of P-type material and N-type material, respectively.

FIG. 12 illustrates block 230 of P-type material and block 232 of N-type material. Slabs 234 of P-type material are illustrated as sliced and broken away from block 230. Similarly, slabs 236 of N-type material are illustrated as sliced and broken away from block 232.

Next, at step 202, P-type slabs and N-type slabs are alternately stacked upon one another. It is worth noting here that a passivating agent and/or a separating material may be provided between adjacent slabs of P-type material and N-type material. If separating layers are used, they may be carried through to the finished device, or they may be removed in order to leave a space between P-type material and N-type material of the finished device if they are not removed, then they should be an electrically insulating material.

In accordance with a particular embodiment of the present invention, P-type slabs and N-type slabs are stacked until an end is approximately 0.8 inches squared, and the length is approximately 2 inches. In accordance with this embodiment, a total of 26 slabs (13 N-type slabs and 13 P-type slabs) may be used.

Figure 13:
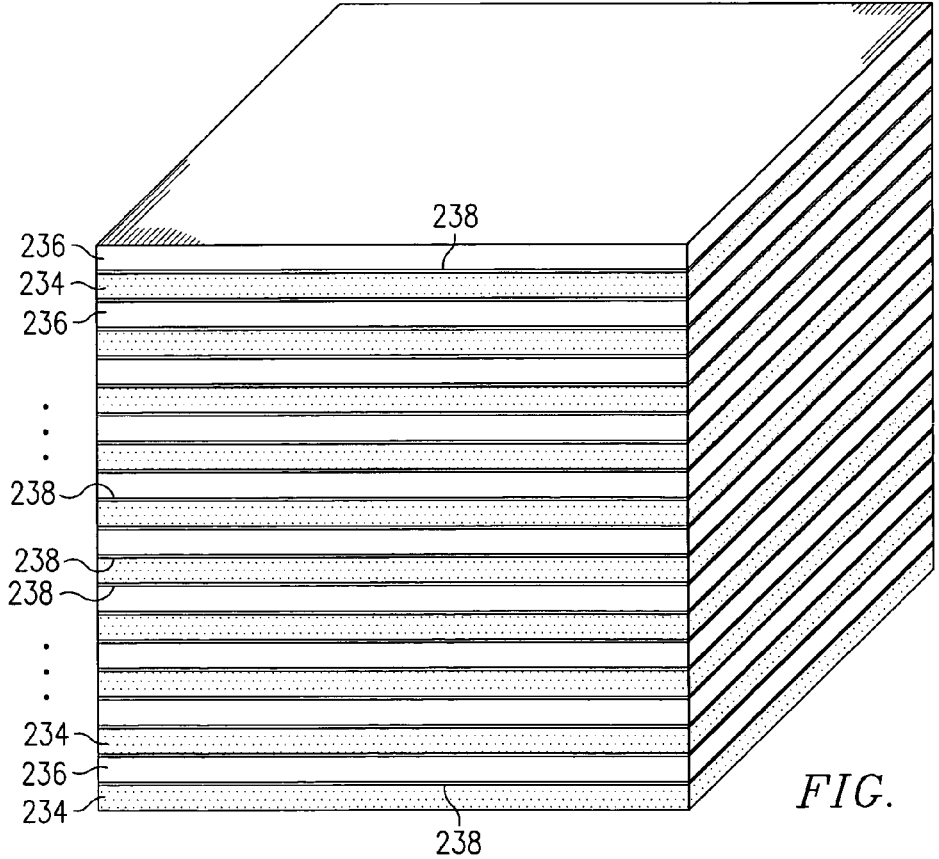
FIG. 13 illustrates an end view of a plurality of slabs of N-type material alternatingly stacked with a plurality of slabs of P-type material.

FIG. 13 illustrates a stack of P-type slabs 234 alternatingly stacked with N-type slabs 236. As discussed above, a barrier or separating layer 238 may be disposed between one or more adjacent ones of P-type slabs 234 and N-type slabs 236.

At step 204, a hybrid P/N ingot is formed. There are a variety of processes available for forming the P/N ingot, some of which are described within this specification. For example, and in accordance with a particular embodiment, the alternating stack of P-type slabs and N-type slabs are loaded into a chamber, heated, and pushed through a die (e.g. extruded). In this embodiment, the cross section may be reduced by a factor of 4 to 16 (e.g., 9) during the extrusion process. In this manner, a width and height of the cross section may each be reduced by a factor of 2 to 4, respectively. Thus, the original thickness of the slab (e.g., 30 mils) may be reduced by a factor of 2 to 4, respectively (e.g., to approximately 10 mils), in the finished product. This allows for a grid of P-type and N-type slabs with spacing of approximately 10 mils or less, which has not been accomplished by prior art techniques.

In accordance with this embodiment, the finished ingot may be 9 to 10 inches long. By slicing wafers along the length of the ingot, cross sectional areas along the length may be identified to find suitable patterns of N-type and P-type material. In one example, approximately 5 to 6 inches of "usable" material was identified along the 9 to 10 inch length. The cross sectional area of the ingot in this embodiment was approximately 0.26 inches squared. In an alternative embodiment, hot forging may be used to form the P/N-type ingot, in lieu of hot extrusion. Hot forging, like hot extrusion, lessens the layer thicknesses of the slab. Hot forging essentially squeezes the slabs together and allows them to move in at least one direction, to reduce the thickness of the individual slabs into a single component.

Suitable areas of the ingot may be sliced into a plurality of wafers of a predetermined thickness, for further processing. For example, the ingot may be sliced to obtain a plurality of wafers of a thickness range of ten to forty mils. In a particular embodiment of the present invention, the thickness may be selected within the range of twenty to thirty mils.

In accordance with still another embodiment, hot pressing may be used to form the P/N-type ingot. Unlike hot forging and hot extrusion, hot pressing is not a process that would substantially change the slab layer thicknesses. Instead, heat and pressure are applied to the "stack" of P-type and N-type slabs with no room to flow. This accomplishes the bonding of the individual slabs into a single component.

At step 206, the P/N-type ingot is sliced into P/N-type wafers. The wafers that are obtained from this process may be large enough in cross section to support multiple thermoelectric circuits or multiple thermoelectric devices, per wafer (e.g., approximately equal to, or greater than 1 cm$^2$). Furthermore, the wafers obtained in accordance with step 206 may be further processed according to the method described in FIG. 10.

At step 208 a diffusion barrier metallization may be applied to at least a subset of the P-type regions and N-type regions. The diffusion barrier may comprise nickel or any other suitable barrier material (e.g., molybdenum). The diffusion barrier may optionally be provided in order to provide a surface for soldering and inhibit interactions between the solder and the thermoelectric materials. In a particular embodiment of the present invention, nickel may be applied as the diffusion barrier, using an electrolytic or electroless process. Multiple layers may also be used for the diffusion barrier. The layers may be applied during the same step, and may comprise different materials.

Figure 14:
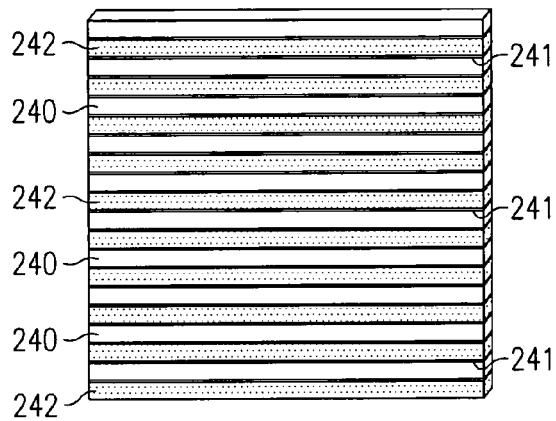
FIG. 14 illustrates a top view of a wafer formed in accordance with the teachings of the present invention.

FIG. 14 illustrates front view of the wafer. Alternating layers of P-type regions 240 and N-type regions 242 are visible in FIG. 14, as well as optional diffusion barriers 241 disposed between P-type regions and adjacent N-type regions.

Next, at step 210, a patterned, current-carrying metallization may optionally be provided to one side of the P/N-type wafer to form a thermoelectric circuit thereupon.

In order to perform additional processing on the P/N-type wafers, the wafers may be coupled to a temporary substrate using a bonding media, at step 212. The substrate and bonding media are considered temporary, since they may be removed later during the fabrication process. The substrate allows for easier manipulation and processing of the wafers, in order to accomplish some or all of the steps described below.

Figure 15:
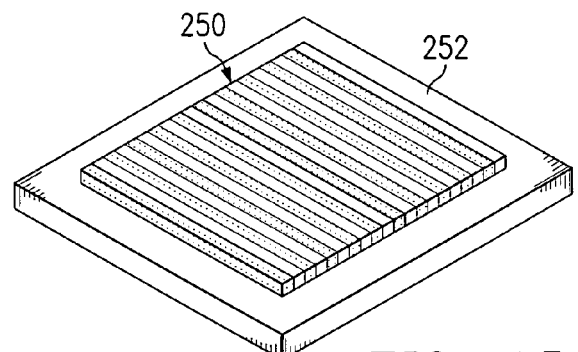
FIG. 15 illustrates a wafer coupled with a temporary substrate, in accordance with a particular embodiment of the present invention.

It may be desirable to reduce the thickness of the P/N-type wafer, to a predetermined or desired height. Therefore, at step 214, thinning of the P/N-type wafer is accomplished while the wafer is mounted on the temporary substrate. Thinning may be accomplished in accordance with various known techniques, including lapping (i.e., a precision polishing technique), and/or mechanical grinding, milling and/or machining. FIG. 15 illustrates a wafer 250 coupled with a temporary substrate 252, prior to the application of the patterned metallization.

At step 216, a second diffusion barrier metallization is applied to at least a subset of the P-type regions and N-type regions on the other side of the wafer from the diffusion barrier of step 208. Also, at step 218, a second thermoelectric circuit is formed on the same side as the diffusion barrier of step 216. The thermoelectric circuit is formed by applying patterned, current-carrying metallization to the P/N-type wafer.

At step 220; at least a portion of the P-type regions of the wafer may optionally be separated from adjacent ones of the N-type regions of the wafer. In accordance with this step, the wafer is essentially divided into an array of isolated P-type elements and N-type elements, while the wafer is attached to the temporary substrate. This step may be accomplished using one or more of a variety of known techniques. For example, the separation may be accomplished using an abrading process to remove material from the wafer. Abrading is a process in which the wafer is masked and bombarded with a stream of particles (e.g., alumina particles), to remove unmasked portions of the wafer.

Alternatively, the separating may be accomplished using a masking/wet-etching technique. Similarly, the separation may be accomplished using a dry-etching technique. In alternative embodiments, variations or combinations of known techniques including abrading, wet-etching, dry-etching, laser machining and/or milling may be used to accomplish this step of separating P-type regions from N-type regions. Also, as described above with regarding to FIG. 9, the separation of P-type regions from N-type regions may be accomplished by "dicing".

At step 222, the resulting thermoelectric circuit may optionally be coupled to a plate. The plate may provide electrical isolation of the thermoelectric circuit from another component of the thermoelectric assembly. In a particular embodiment, the plate may include a first patterned metallization, to provide a solder based thermal link and/or enhance current carrying characteristics of the thermoelectric circuit. This step is not required and may be omitted if a permanent plate is not desired. The construction of thermoelectric devices without permanent plates ("skeleton coolers") will be described later and in more detail.

Figure 16:
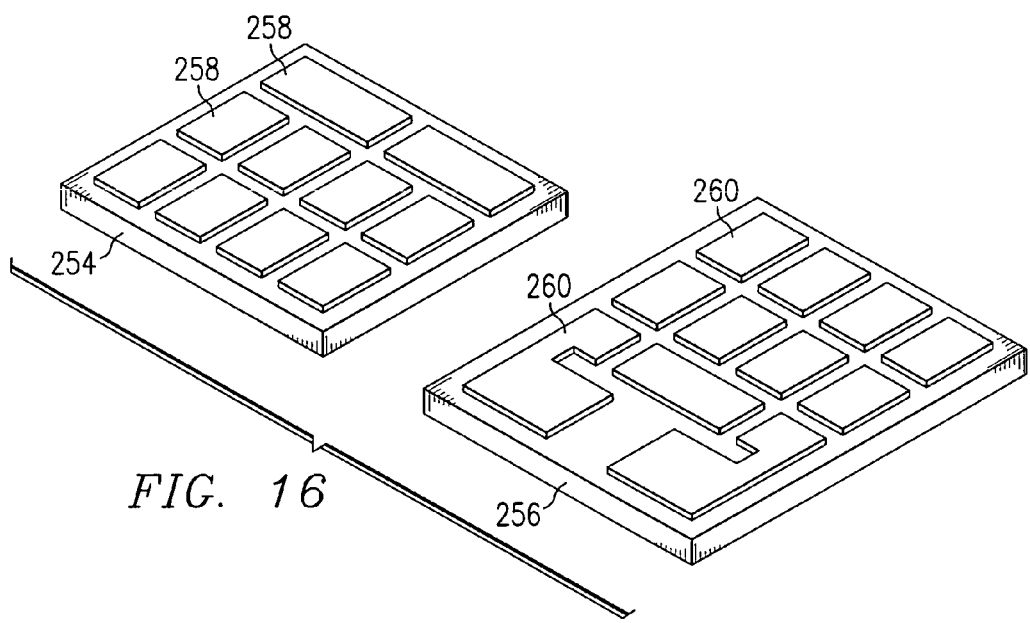
FIG. 16 illustrates a patterned metallization formed upon a ceramic substrate, in accordance with a particular embodiment of the present invention.

At step 224, the temporary substrate and bonding media are detached from the P-type and N-type elements that are coupled on the first plate. If permanent plates are desired, the thermoelectric circuit may be coupled with a second plate, at an opposite end of the first plate. Like the first plate, the second plate may be provided with a patterned metallization in order to form a continuous circuit with the P-type and N-type elements, at step 226. FIG. 16 illustrates ceramic plates 254 and 256, that include patterned metallizations 258 and 260, respectively.

As discussed above, it may be desired to form a thermoelectric device without permanent plates. This configuration may be referred to as a skeleton cooler. The skeleton cooler comprises P-type and N-type thermoelectric material and metal interconnects, but does not include permanent ceramic plates (ceramic plates are optional). This provides the user with an option for directly connecting the skeleton cooler to a device or component that needs cooling. For example, if the device or component were provided with a matching metallization pattern, the skeleton cooler could be welded or soldered directly to the device or component.

FIG. 11 illustrates an alternative embodiment of forming P/N-type wafers that may be further processed in accordance with the techniques described throughout the specification. The method begins at step 300, where P-type powder, and N-type powder are provided. The powders may be obtained or manufactured in accordance with various known techniques. For example, blocks of P-type material and blocks of N-type material may be pulverized into powder form. At step 302, the P-type powder and N-type powder is loaded into a tool in alternating layers of P-type powder and N-type powder.

Next, at step 304, the P-type powder and the N-type powder are consolidated using pressure and high temperature, in order to form a P/N-type ingot. At step 306, the thickness of the P/N-type ingot may be reduced. Various techniques are available for reducing the thickness of P/N-type ingot. For example, as described above, hot forging, and/or hot extruding of the P/N-type ingot may be performed, in order to decrease the thickness of the P/N-type ingot.

At step 308, the P/N-type ingot is sliced into P/N-type wafers. The wafers that are obtained in accordance with the method of FIG. 11 may be further processed or used in accordance with one or more of the various techniques described within this specification, as well as others. Furthermore, the wafers obtained by slicing of the P/N-type ingot may be large enough in cross section to support multiple thermoelectric circuits and/or thermoelectric devices, per wafer.

The teachings of the present invention provide for a variety of methods to obtain wafers containing both N-type thermoelectric material and P-type thermoelectric material optionally separated from one another by barriers. Such wafers may be used in the manufacture of thermoelectric devices, as described herein and those otherwise known in the art. One feature of a thermoelectric device that may be fabricated in accordance with the teachings of the present invention, is the linking of one or more P-type elements electrically in series and thermally in parallel with one or more N-type elements such that heat is "pumped" from one end of the elements to the other, when a direct current is applied.

The N-type and P-type elements of the wafers of the present invention may be electrically isolated from one another at the individual level, or, in another embodiment adjacent columns may be isolated from one another while elements within a column are not isolated. The elements may be separated by an air gap, or by an electrical insulator.

The "linkage" between elements may require a conductor with a thickness appropriate for the desired current level (e.g., the "interconnect"), and the interconnect may be attached to the elements directly (via sputtering, plating, chemical vapor deposition, physical vapor deposition or other means), or by a solder joint, or by an electrically conducting epoxy or similar adhesive. Regardless of the means for attaching, or coupling the interconnect, the joining surface of the elements may be bare, or may be covered with metal layers. The series electrical circuit can be constructed from individual elements, or from pairs of elements (e.g., a "series-parallel circuit").

If the P-type and N-type thermoelectric elements are isolated by an air gap, this gap is formed by removal of a separating layer or removal of thermoelectric material using a method such as dicing, abrading, milling, other mechanical means, laser ablation, wet or dry etching. The resulting device may be electrically isolated by ceramic plates such as, but not limited to AlO, BeO, and AlN, by insulating films such as Kapton, liquid crystal polymers, etc., by coatings, or by a combination of insulated plates, films or coatings.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A method of forming a thermoelectric device, comprising:
   extruding a P/N-type billet to form a P/N-type extrusion;
   slicing the P/N-type extrusion into a plurality of P/N-type wafers, each having a first plurality of P-type regions and a first plurality of N-type regions;
   applying diffusion barrier metallization to at least a subset of the P-type regions and N-type regions;
   attaching one side of at least one P/N-type wafer to a temporary substrate, using a bonding media;
   coupling the at least one P/N-type wafer to a first plate having a first patterned metallization to form a thermoelectric circuit, wherein the subset of P-type regions and N-type regions are arranged electrically in series and thermally in parallel;
   detaching the temporary substrate and bonding media from the at least one P/N-type wafer; and
   coupling the at least one P/N-type wafer to a second plate having a second patterned metallization.

2. The method of claim 1, wherein the P/N-type billet includes P-type regions and N-type regions, and separating layers disposed between the P-type regions and adjacent N-type regions.

3. The method of claim 1, further comprising separating the P/N-type regions of the P/N-type wafer into an array of isolated P-type and N-type elements while the wafer is attached to the temporary substrate.

4. The method of claim 3, wherein separating the P/N-type regions of the wafer into an array of isolated P-type and N-type elements comprises dicing the P/N-type regions of the P/N-type wafer.

5. The method of claim 3, wherein separating the P/N-type regions of the P/N-type wafer into an array of isolated P-type and N-type elements comprises abrading the P/N-type regions of the P/N-type wafer.

6. The method of claim 3, wherein separating the P/N-type regions of the P/N-type wafer into an array of isolated P-type and N-type elements comprises wet etching the P/N-type regions of the P/N-type wafer.

7. The method of claim 3, wherein separating the P/N-type regions of the P/N-type wafer into an array of isolated P-type and N-type elements comprises dry etching the P/N-type regions of the P/N-type wafer.

8. The method of claim 3, wherein separating the P/N-type regions of the P/N-type wafer into an array of isolated P-type elements and N-type elements comprises electrostatic discharge machining.

9. The method of claim 3, wherein separating the P/N-type regions of the P/N-type wafer into an array of isolated P-type elements and N-type elements comprises laser cutting.

10. The method of claim 1, wherein attaching one side of at least one P/N-type wafer to a temporary substrate, using a bonding media comprises attaching one side of at least one P/N-type wafer to a temporary substrate, using a bonding media between the P/N-type wafer and the temporary substrate to couple the P/N-type wafer to the temporary substrate.

11. A method of forming a thermoelectric device, comprising:
- providing a P/N-type ingot having a first plurality of P-type regions and a first plurality of N-type regions;
- slicing the P/N-type ingot into a plurality of P/N-type wafers;
- applying a diffusion barrier metallization to at least a first subset of the P-type regions and N-type regions;
- applying a first patterned current-carrying metallization to a first side of the P/N-type wafer to form a thermoelectric circuit;
- coupling the first side of at least one of the P/N-type wafers to a temporary substrate using a bonding media;
- thinning the P/N-type wafer to a desired height while the wafer is mounted on the temporary substrate;
- applying a second diffusion barrier metallization to at least a second subset of the P-type regions and N-type regions on a second side of the P/N-type wafer, while the wafer is mounted to the temporary substrate;
- applying a second patterned current-carrying metallization to the second side of the P/N-type wafer to form a thermoelectric circuit;
- separating at least a portion of the P/N-type regions of the wafer while the wafer is attached to the temporary substrate; and
- decoupling the thermoelectric device from the temporary substrate and the bonding media.

12. The method of claim 11, further comprising thermally coupling the thermoelectric device to one or more permanent substrates to provide electrical isolation.

13. The method of claim 11, further comprising extruding a P/N-type billet to form the P/N-type ingot.

14. The method of claim 11, further comprising hot rolling a P/N-type billet to form the P/N-type ingot.

15. The method of claim 11, further comprising hot forging a P/N-type billet to form the P/N-type ingot.

16. The method of claim 11, wherein separating the P/N-type regions of the wafer into an array of isolated P-type and N-type elements comprises dicing the P/N-type regions of the P/N-type wafer.

17. The method of claim 11, wherein separating the P/N-type regions of the P/N-type wafer into an array of isolated P-type and N-type elements comprises electrostatic discharge machining.

18. The method of claim 11, wherein separating the P/N-type regions of the wafer into an array of isolated P-type and N-type elements comprises laser cutting.

19. The method of claim 11, wherein separating the P/N-type regions of the P/N-type wafer into an array of isolated P-type and N-type elements comprises abrading the P/N-type regions of the P/N-type wafer.

20. The method of claim 11, wherein separating the P/N-type regions of the P/N-type wafer into an array of isolated P-type and N-type elements comprises wet etching the P/N-type regions of the P/N-type wafer.

21. The method of claim 11, wherein separating the P/N-type regions of the P/N-type wafer in to an array of isolated P-type and N-type elements comprises dry etching the P/N-type regions of the P/N-type wafer.

22. The method of claim 11, further comprising applying a thermally and electrically insulating material between the separated P/N-type regions of the thermoelectric device.

23. The method of claim 11, further comprising applying an electrically insulative, thermally conductive layer over the second side of the P/N-type wafer.

24. The method of claim 23, further comprising applying a metallization layer over the electrically insulative, thermally-conductive layer.

* * * * *

UNITED STATES PATENT AND TRADEMARK OFFICE
CERTIFICATE OF CORRECTION

PATENT NO. : 7,619,158 B2
APPLICATION NO. : 10/897871
DATED : November 17, 2009
INVENTOR(S) : Sharp et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1036 days.

Signed and Sealed this

Twenty-sixth Day of October, 2010

David J. Kappos
*Director of the United States Patent and Trademark Office*